US010283969B2

(12) United States Patent
Nishimura

(10) Patent No.: US 10,283,969 B2
(45) Date of Patent: May 7, 2019

(54) SOLAR PHOTOVOLTAIC OUTPUT OPTIMIZER CIRCUIT

(71) Applicants: MERSINTEL, CO., LTD., Kyoto-shi, Kyoto (JP); CLEAN ENERGY FACTORY CO., LTD., Nemuro-shi, Hokkaido (JP)

(72) Inventor: Hiroyuki Nishimura, Kyoto (JP)

(73) Assignees: MERSINTEL, CO., LTD., Kyoto-Shi, Kyoto (JP); CLEAN ENERGY FACTORY CO., LTD., Nemuro-shi, Hokkaido (JP)

( * ) Notice: Subject to any disclaimer, the term of this patent is extended or adjusted under 35 U.S.C. 154(b) by 127 days.

(21) Appl. No.: 15/501,045

(22) PCT Filed: Aug. 6, 2015

(86) PCT No.: PCT/JP2015/072327
§ 371 (c)(1),
(2) Date: Feb. 1, 2017

(87) PCT Pub. No.: WO2016/021677
PCT Pub. Date: Feb. 11, 2016

(65) Prior Publication Data
US 2017/0229873 A1    Aug. 10, 2017

(30) Foreign Application Priority Data

Aug. 6, 2014  (JP) ................. 2014-160526

(51) Int. Cl.
*H02J 3/38*   (2006.01)
*H02M 1/32*   (2007.01)
(Continued)

(52) U.S. Cl.
CPC ........ *H02J 3/383* (2013.01); *H01L 31/02021* (2013.01); *H02H 9/04* (2013.01);
(Continued)

(58) Field of Classification Search
CPC ..... H02J 3/383; H01L 31/02021; H02H 9/04; H02M 1/32; H02M 3/07; H02M 3/33507; H02M 3/3353; H02S 50/00; Y02E 10/56
(Continued)

(56) References Cited

U.S. PATENT DOCUMENTS 6,344,985 B1  2/2002 Akerson
9,118,215 B2  8/2015 Fishman et al.
(Continued)

FOREIGN PATENT DOCUMENTS

JP   2006-101581 A   4/2006
JP   2011-170836 A   9/2011

OTHER PUBLICATIONS

PCT, "International Search Report for International Application No. PCT/JP2015/072327".

*Primary Examiner* — Carlos D Amaya
(74) *Attorney, Agent, or Firm* — Manabu Kanesaka

(57) ABSTRACT

A solar photovoltaic output optimizer circuit includes a PV input device for receiving output of a solar photovoltaic panel; a switching device for converting a DC voltage input through the PV input device into a predetermined pulse voltage or AC voltage; and a voltage doubler rectification device for stepping up power output of the switching device to a predetermined voltage. The PV input device includes: an inductance L1 connected in series to "+" output of the PV panel; and a surge protection circuit that is connected in parallel to the inductance L1, operates so as to absorb surge voltage to occur in output of the inductance L1 only when output of the PV panel is small and normal control cannot be performed, and is automatically separated from the inductance L1 when the output of the PV panel is large.

9 Claims, 8 Drawing Sheets

(51) Int. Cl.
    *H02H 9/04*     (2006.01)
    *H02M 3/07*     (2006.01)
    *H02M 3/335*     (2006.01)
    *H01L 31/02*     (2006.01)
    *H02S 50/00*     (2014.01)

(52) U.S. Cl.
    CPC ............... *H02M 1/32* (2013.01); *H02M 3/07* (2013.01); *H02M 3/3353* (2013.01); *H02M 3/33507* (2013.01); *H02S 50/00* (2013.01); *Y02E 10/56* (2013.01)

(58) Field of Classification Search
    USPC .......................................................... 307/52
    See application file for complete search history.

(56) References Cited

U.S. PATENT DOCUMENTS

2013/0322127 A1     12/2013    Moiseev
2014/0085937 A1      3/2014    Chen et al.

SOLAR PHOTOVOLTAIC OUTPUT OPTIMIZER CIRCUIT

RELATED APPLICATIONS

The present application is National Phase of International Application No. PCT/JP2015/072327 filed Aug. 6, 2015, and claims priority from Japanese Application No. 2014-160526, filed Aug. 6, 2014, the disclosure of which is hereby incorporated by reference herein in its entirety.

TECHNICAL FIELD

The present invention relates to a power generation system through use of a solar photovoltaic panel and, in particular, to a solar photovoltaic output optimizer circuit that can stably harvest generated output by optimizing output from a solar photovoltaic panel with large output variation.

BACKGROUND ART

Along with diversification of energy resources, power generation through use of a solar photovoltaic panel has become widespread as a type of renewable energy. Against the backdrop of lack of energy sources and reduction in $CO_2$ emission in recent years, large-scale solar photovoltaic power generation plants, each of which exceeds 1000 kW and is called mega solar, have been actively built. Hereinafter, solar power generation is also called PV (Photo-Voltaic), and a solar photovoltaic panel (or solar panel) used therefor is also called a PV panel.

Output of a PV panel varies according to the amount of irradiation light. In particular, when the amount of light is small, such as at dawn, the output is small and the internal impedance is high. Connection of a load in a state with a high internal impedance reduces the voltage, which prevents normal operation as a power source, and the power source becomes an unstable power source. Control for stable operation even in a state where a PV panel receives a low amount of light is required. Such control is called optimization. Optimization means (circuit) is called an optimizer.

FIG. 6 is a circuit diagram illustrating a basic configuration of a conventional PV optimizer. FIG. 7 is an operation waveform diagram showing the level of gate signal of switching transistors constituting the circuit of FIG. 6. In FIG. 6, the "+" output and "−" output of the PV panel (not shown) are input into a PV input 101 (IN+) and a PV input 102 (IN−) of an optimizer 100: ground. Reference signs Q1, Q2, Q3, Q4 and Q5 denote first, second, third, fourth and fifth switching transistors, respectively. MOSFETs for N-channel power are adopted therefor. The enhancement type shown in the diagram is preferable for this circuit. However, the type is not necessarily limited thereto. Any type having similar functions may be adopted instead. Reference sign L1 denotes an inductance that has one end a connected to the PV input 101, and another end b connected to the drain terminals of the first switching transistor Q1, the second switching transistor Q2 and the fourth switching transistor Q4.

Reference sign T1 denotes a transformer that has one terminal a of primary winding (on the primary side) connected to the source electrode of the second switching transistor Q2 and the drain electrode of the third switching transistor Q3, and another electrode b connected to the source electrode of the fourth switching transistor Q4 and the drain electrode of the fifth switching transistor Q5. An end c of secondary winding (on the secondary side) of the transformer T1 that has the same polarity as that of the end a on the primary side is connected to the anode of a first diode D1 and the cathode of a second diode D2. Another end d is connected to a series connection point between a first capacitor C1 and a second capacitor C2, which are connected in series. The free end of the first capacitor C1 is connected to the cathode of the first diode D1 and one output 104 (OUT+) between the optimizer outputs. The free end of the second capacitor C2 is connected to the anode of the second diode D2 and the other output 105 (OUT−) between the optimizer outputs.

The source of the first switching transistor Q1, the source of the third switching transistor Q3, and the source of the fifth switching transistor Q5 are connected to the ground. The second transistor Q2 and the fourth switching transistor Q4 constitute a high-side switch. The third switching transistor Q3 and the fifth switching transistor Q5 constitute a low-side switch.

During normal operation of the PV optimizer 100 shown in FIG. 6, the gate signals Q1-G, Q2-G, Q3-G, Q4-G and Q5-G of the first switching transistor Q1, the second switching transistor Q2, the third switching transistor Q3, the fourth switching transistor Q4 and the fifth switching transistor Q5 are as shown in FIG. 7. Means for generating the gate signals Q1-G, Q2-G, Q3-G, Q4-G and Q5-G of the first to fifth switching transistors Q1 to Q5 is described later. The PV optimizer 100 is a bridge type step-up and voltage doubler rectification circuit. In FIG. 7, the switching frequency is, for example, 50 kHz. The first half of one period T is A, and the latter half is B. When the gate signal G in the first or latter half is at a high level (H), the corresponding transistor is ON. When the signal is at a low level (L), this transistor is OFF.

In the normal operation state, in the first half A of the period T, in an Aa interval, all the first to fifth switching transistors Q1 to Q5 are ON to excite the inductance L1; in an Ab interval, the first switching transistor Q1, the third switching transistor Q3 and the fourth switching transistor Q4 are turned OFF to thereby turn on the second switching transistor Q2 and the fifth switching transistor Q5. Consequently, the end a on the primary side of the transformer T1 is positive (+) and the other end b is ground (GND), thereby exciting the transformer T1 in the direction from the one end a to the other end b.

Upon entering the latter half B of one period, all the first to fifth switching transistors Q1 to Q5 are turned on to excite the inductance L1. Upon entering a Bb interval, the first switching transistor Q1, the second switching transistor Q2 and the fifth switching transistor Q5 are turned off to turn on only the third switching transistor Q3 and the fourth switching transistor Q4, thereby making the other end b on the primary side of the transformer T1 be positive (+) and making the one end a on the primary side of the transformer T1 be the ground (GND) to excite the transformer T1 in the direction from the other end b to the one end a, which is opposite to the above case.

The operation of one period of the switching frequency is thus finished, and the operation thereafter is its repetition. As with the primary side, the secondary side of the transformer T1 repeats the positive (+) and negative (−) polarities every half a period (T/2) of the switching frequency, and a voltage stepped up twice as high as the secondary-side voltage of the transformer T1 is obtained through the voltage doubler rectification by the first diode D1, the second diode D2, the first capacitor C1 and the second capacitor C2. The first switching transistor Q1 is not necessarily included. However, provision of this transistor can reduce the ON resistance while the second switching transistor Q2 to the fifth switching transistor Q5 are ON and, in turn, reduce the load.

During the normal operation, the operation is performed according to the gate signals shown in FIG. 7, and PWM control that changes the pulse width in the Aa interval in the first half A and the Ba interval of the latter half B in the switching period, and PFM control that changes time in the first half A and the latter half B in the switching period T, i.e., the period, are performed.

Disclosure of such types of conventional arts includes Patent Literature 1, Patent Literature 2 and Patent Literature 3.

CITATION LIST

Patent Literature

Patent Literature 1: Japanese Patent Laid-Open No. 2006-101581
Patent Literature 2: Japanese Patent Laid-Open No. 2011-170836
Patent Literature 3: Japanese Patent Laid-Open No. 2013-541930

SUMMARY OF INVENTION

Technical Problem

Basically, the output of the solar photovoltaic panel (PV panel) varies according to the amount of light with which the panel is irradiated. However, in particular, when the amount of light is small, such as at dawn, the output is also small and the internal impedance is high. Connection of a load in a situation with a high internal impedance reduces the voltage, which prevents a normal operation as a power source. Control is thus required for stable operation even in such a situation.

In order to stably operate the PV panel as a power source even though the panel is at a low output, in the Aa interval and Ba interval that are time periods during which the inductance L1 in FIG. 6 is excited (the period T of the switching signal shown in FIG. 7), driving by significantly short pulses or setting the period of A+B to significantly long is effective.

However, in a case where the Aa interval and Ba interval shown in FIG. 7 are shortened, presence of the transformer T1 increases the time period during which the second switching transistor Q2 and fifth switching transistor Q5, or the third switching transistor Q3 and fourth switching transistor Q4 are ON, and the output of the PV panel is resultantly short-circuited.

FIG. 8 is a waveform diagram of the switching signals of the switching transistors in the case where the amount of irradiation on the PV panel is small and the Aa interval and the Ba interval are reduced. In order to prevent the short circuit of the output of the PV panel, the second switching transistor Q2 and the fourth switching transistor Q4 are turned off for a constant period from the termination of an Ab interval in the first half and a Bb interval in the latter half in the period T, as shown in FIG. 8, the gate signals of the switching transistors are generated so as to achieve a state shown in an Ac interval and a Bc interval.

In particular, when the PV panel is in a significantly low output state, the stable operation can be continued even at a low power by increasing the time periods of the Ac interval and Bc interval as long as possible.

However, at the moment when the second switching transistor Q2 and fourth switching transistor Q4 are turned off as described above, the other end b of the inductance L1 is brought into a released state and a significantly high surge voltage occurs. As a result, the surge voltage is applied to the first switching transistor Q1, second switching transistor Q2 and fourth switching transistor Q4. This application causes a possibility of causing breakage of these switching transistors.

The present invention has an object to continue stable operation even when the PV panel is at a low power in a significantly low output state, and to provide a solar photovoltaic output optimizer circuit that includes means for protecting transistors from a surge voltage that is to occur in an inductance at the time.

Solution to Problem

In order to achieve the above object, configuration examples of the solar photovoltaic output optimizer circuit according to the present invention are listed as follows. Note that signs and the like of embodiments to the respective configuration portions are attached to clarify the configuration.

(1) A solar photovoltaic output optimizer circuit used for a solar photovoltaic power generation system for stably harvesting power from power output of a solar photovoltaic panel having varying output, includes:

PV input means 200 for receiving DC output of the solar photovoltaic panel; switching means 300 for converting a DC voltage input through the PV input means into a predetermined pulse voltage or AC voltage; and voltage doubler rectification means 400 for stepping up power output of the switching means 300 to a predetermined DC voltage. The DC voltage output of the voltage doubler rectification means 400 is input into a power conditioner 150 that converts the DC voltage output into AC voltage output and outputs the converted output to an external system. The PV input means 200 includes: an inductance L1 connected in series to "+" output of the PV panel; and a surge protection circuit 250 that is connected in parallel to the inductance L1, operates so as to absorb surge voltage to occur in output of the inductance L1 only when output of the PV panel is small and normal control cannot be performed, and is automatically separated from the inductance L1 when the output of the PV panel is large.

(2) In the aforementioned (1), the surge protection circuit 250 of the solar photovoltaic output optimizer circuit includes: an inductance L1 whose one end a is connected to an input PV input (+) for receiving (+) output of the PV panel; a (sixth) switching transistor Q6 whose source electrode is connected through a third diode (one diode) D3 to one end a of the inductance L1 and whose drain electrode is connected to another end b of the inductance L1; and a (seventh) switching transistor Q7 whose drain electrode is connected to the source electrode of the (sixth) switching transistor Q6 and whose source electrode is connected to a ground, and a (third) diode D3 whose anode is connected to the source electrode of the (sixth) switching transistor Q6 and whose cathode is connected to one terminal a of the inductance L1 is connected between the source electrode of the (sixth) switching transistor Q6 and the one terminal a of the inductance L1, and the surge protection circuit 250 further includes a (fourth) diode (another diode) D4 whose cathode is connected to a connection point between the source electrode of the (sixth) switching transistor Q6 and the drain electrode of the (seventh) switching transistor (another switching transistor) Q7 and whose source is connected to the ground.

(3) In the aforementioned (1), the surge protection circuit 250 of the solar photovoltaic output optimizer circuit is configured by connecting, to each other: an inductance L1 whose one end a is connected to an input PV input (+) for receiving (+) output of the PV panel; and a (sixth) switching transistor Q6 whose source electrode is connected through a third diode (one diode) D3 to one end a of the inductance L1 and whose drain electrode is connected to another end b of the inductance L1, and a (third) diode D3 whose anode is connected to the source electrode of the (sixth) switching transistor Q6 and whose cathode is connected to one terminal a of the inductance L1 is connected between the source electrode of the (sixth) switching transistor Q6 and the one terminal a of the inductance L1, and the surge protection circuit 250 further includes a (fourth) diode (another diode) D4 whose cathode is connected to the source electrode of the (sixth) switching transistor Q6 and whose anode is connected to the ground.

(4) In the aforementioned (1), the switching means 300 of the solar photovoltaic output optimizer circuit includes: a first switching transistor Q1 whose drain electrode is connected to the other end b of the inductance L1 and whose source electrode is connected to the ground; a second switching transistor Q2 whose drain electrode is connected to the other end b of the inductance L1 and whose source electrode is connected to one input of the voltage doubler rectification means (one end on a primary side of a transformer T1 included in the voltage doubler rectification means); a third switching transistor Q3 whose drain electrode is connected to the source electrode of the second switching transistor Q2 and whose source electrode is connected to the ground; a fourth switching transistor Q4 whose drain electrode is connected to the other end b of the inductance L1 and whose source electrode is connected to another input of the voltage doubler rectification means (another end b on the primary side of the transformer T1 included in the voltage doubler rectification means); and a fifth switching transistor Q5 whose drain electrode is connected to the other input of the voltage doubler rectification means (the other end b on the primary side of the transformer T1 included in the voltage doubler rectification means) and whose source electrode is connected to the ground.

(5) In the aforementioned (1), the second switching transistor Q2 and the fourth switching transistor Q4 included in the switching means 300 of the solar photovoltaic output optimizer circuit operate as high-side switches, and the third switching transistor Q3 and the fifth switching transistor Q5 operate as low-side switches.

(6) In the aforementioned (1), the step-up means 400 of the solar photovoltaic output optimizer circuit includes:

a transformer T1 whose one end a on the primary side is connected to the source electrode of the second switching transistor included in the switching means 300 and the drain electrode of the third switching transistor Q3 and whose secondary side is connected with a voltage doubler step-up circuit;

a first diode D1 whose anode is connected to the one end c on the secondary side of the transformer T1 and whose cathode is connected to a "+" output terminal (OUT+) of the voltage doubler rectification means; a second diode D2 whose cathode is connected to one end c on the secondary side of the transformer T1 and whose anode is connected to "−" output terminal (OUT−) of the voltage doubler rectification means;

a first capacitor C1 whose one end is connected to another end d on the secondary side of the transformer T1 and whose other end is connected to the "+" output terminal (OUT+) of the voltage doubler rectification means; and a second capacitor C2 whose one end is connected to the other d end on the secondary side of the transformer T1 and whose other end is connected to the "−" output (OUT−) terminal of the voltage doubler rectification means.

(7) In any of the aforementioned (2) to (6), the switching transistor included in the solar photovoltaic output optimizer circuit is an enhancement type N-channel power MOSFET.

(8) In any of the aforementioned (1) to (7), output of the solar photovoltaic output optimizer circuit is connected to a power conditioner that outputs AC power to an external system.

(9) In any of the aforementioned (1) to (8), the solar photovoltaic output optimizer circuit is connected to each of a plurality of PV panels whose outputs are connected in parallel.

It is a matter of course that the present invention can be variously modified without departing from the technical thought described in the configuration described above and the detailed description of the invention described later.

Advantageous Effects of Invention

The solar photovoltaic output optimizer circuit according to the present invention can prevent the surge voltage from occurring by the operation of the protection circuit provided for the input circuit, prevent breakage of the switching transistors, and achieve stable operation even with variation in the output of the PV panel.

DESCRIPTION OF EMBODIMENTS

Embodiments of the present invention are hereinafter described with reference to the drawings of exemplary embodiments.

Embodiment 1

Figure 1:
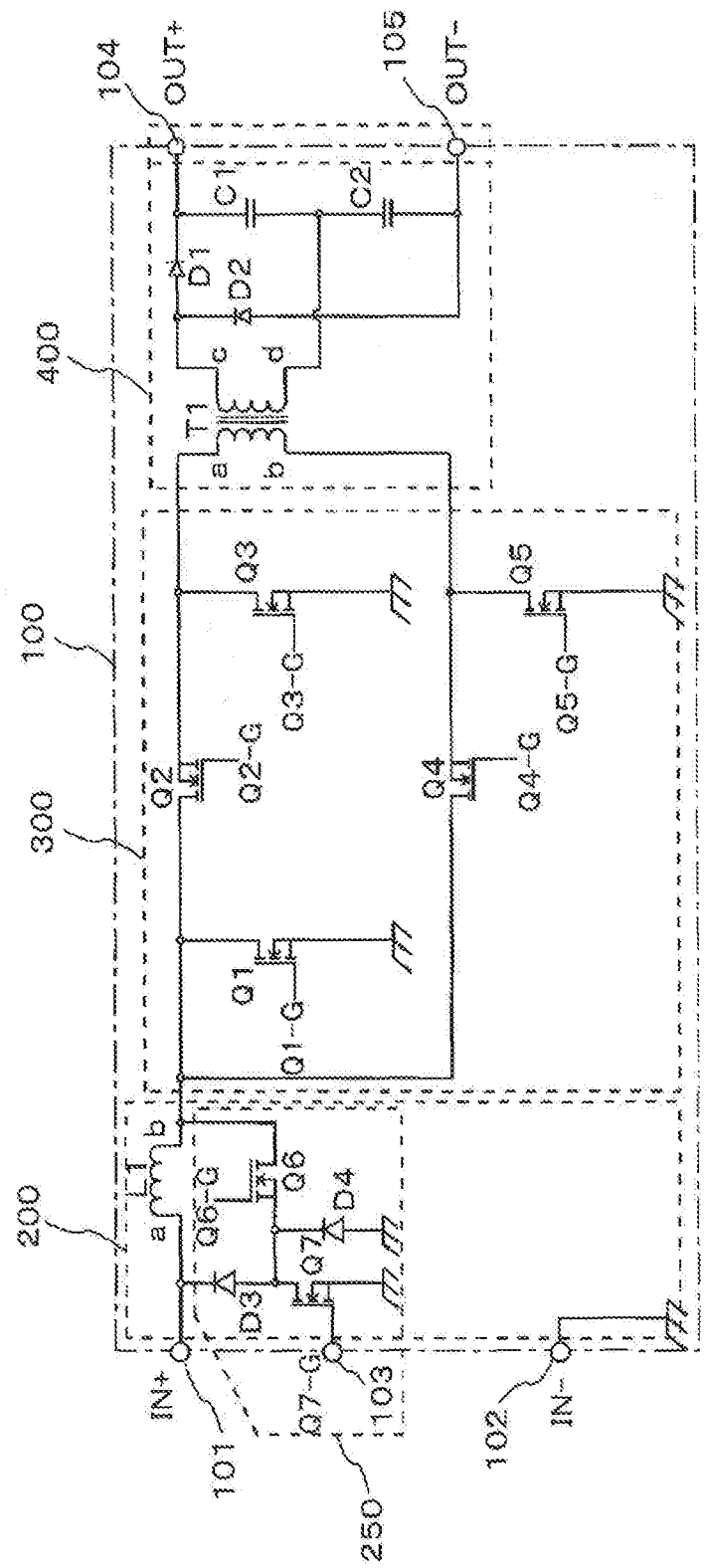
FIG. 1 is a diagram for illustrating a solar photovoltaic output optimizer circuit according to the present invention.
Figure 2:
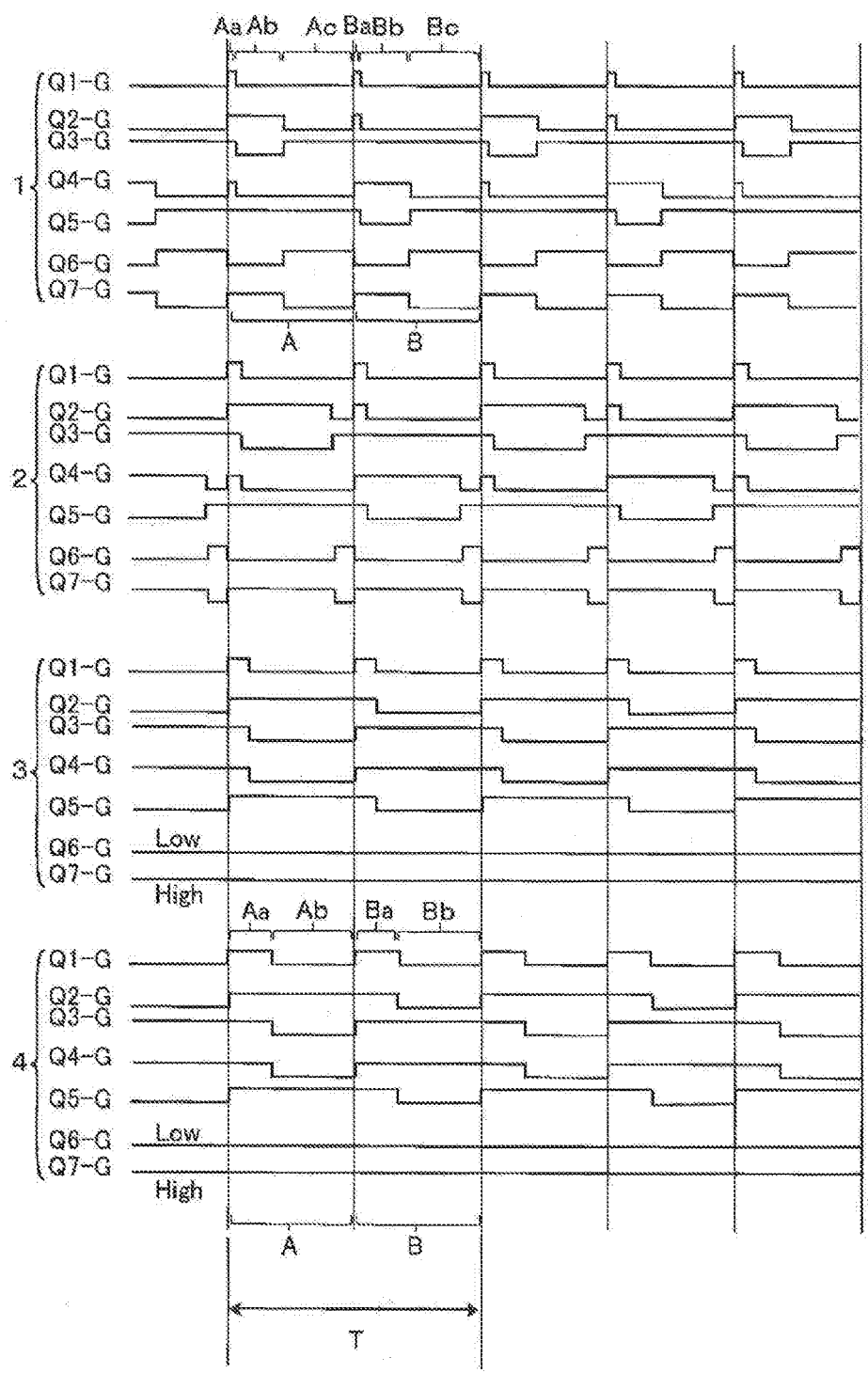
FIG. 2 is an operation timing waveform diagram showing the levels of gate signals of switching transistors constituting the circuit in FIG. 1.
Figure 7:
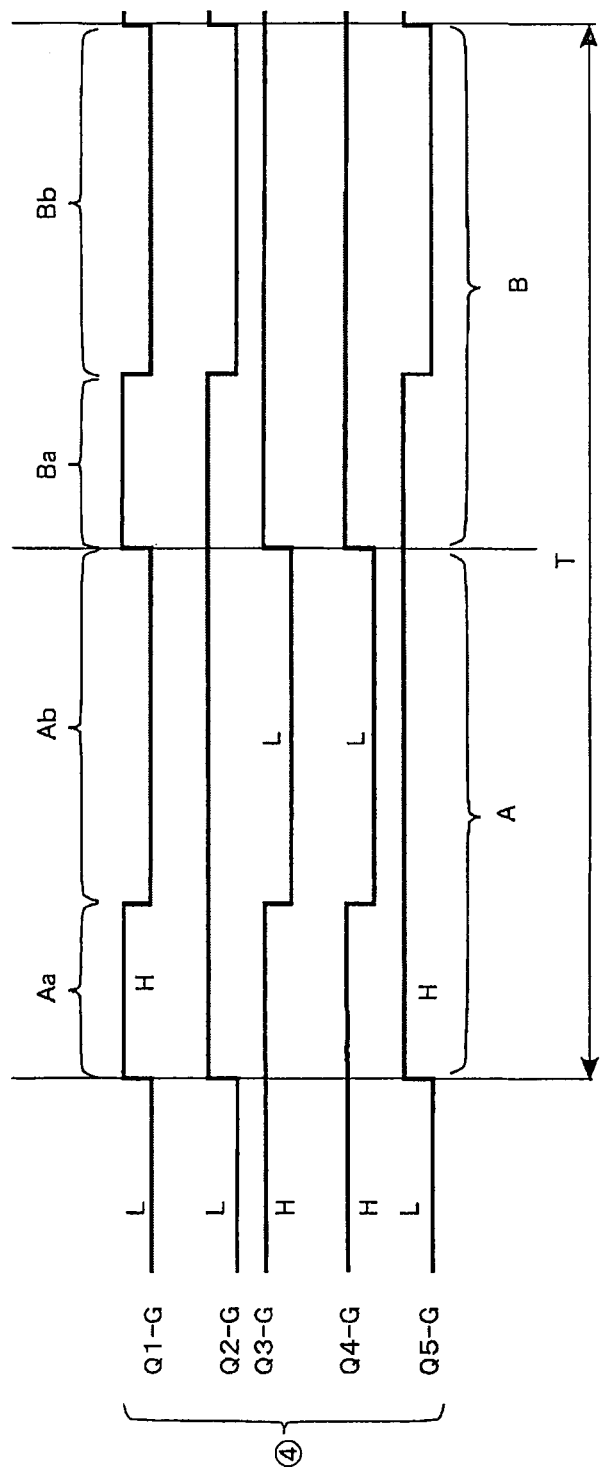
FIG. 7 is an operation waveform diagram showing the levels of gate signals of switching transistors constituting the circuit in FIG. 6.
Figure 8:
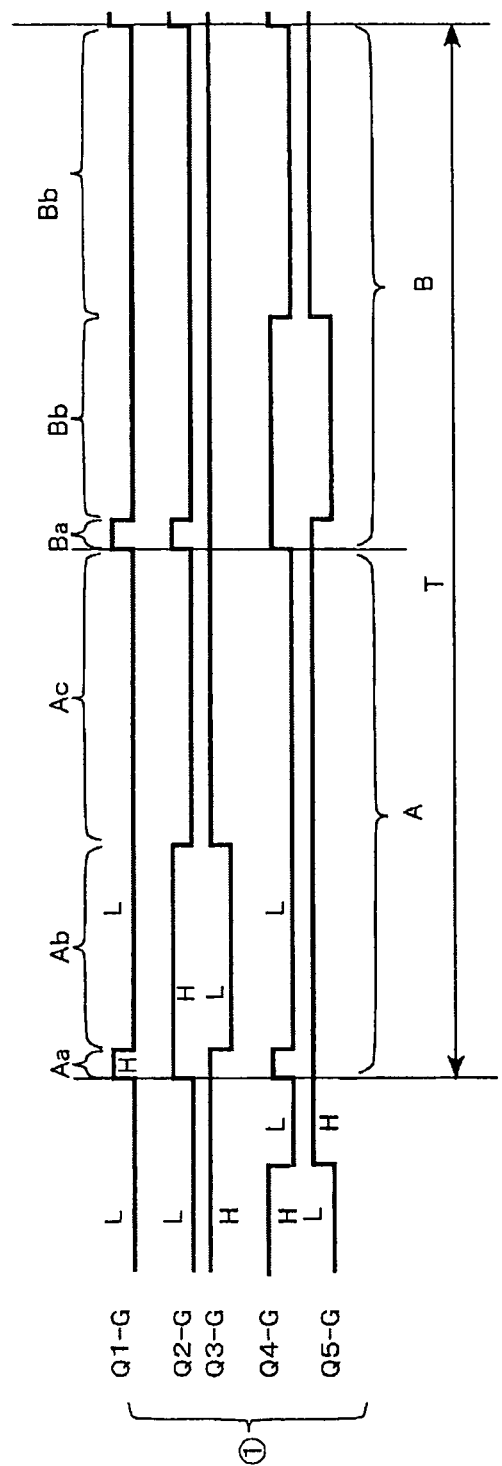
FIG. 8 is a waveform diagram of switching signals of the switching transistors in a case where the amount of irradiation on the PV panel is small and an Aa interval and a Ba interval are shortened.

FIG. 1 is a circuit diagram for illustrating a configuration of Embodiment 1 of the PV optimizer of the present invention. FIG. 2 is an operation timing waveform diagram showing the levels of gate signals of switching transistors constituting the circuit in FIG. 1. FIG. 2 also includes the operation timing waveform described in the conventional art, in order to clarify the description of the operation of this embodiment. "4" in FIG. 2 corresponds to encircled 4 in FIG. 7, and "1" corresponds to encircled 1 in FIG. 8.

The PV optimizer circuit 100 according to Embodiment 1 of the present invention shown in FIG. 1 includes PV input means 200, switching means 300, and voltage doubler rectification means 400. The configurations of the switching means 300 and the voltage doubler rectification means 400 are analogous to those of the conventional PV optimizer described above. Some of the action and operation of the circuit depend on the description of the conventional art, and the description is sometimes redundant partially.

In FIG. 1, the "+" output and "−" output of the PV panel (not shown) are input into a PV input 101 (IN+) and a PV input 102 (IN−: ground) of the optimizer 100. Reference signs Q1, Q2, Q3, Q4 and Q5 denote first, second, third, fourth and fifth switching transistors, respectively. A MOSFET for N-channel power is adopted therefor. The enhancement type shown in the diagram is preferable for this circuit. However, the type is not necessarily limited thereto. Any type having similar functions may be adopted instead.

A surge protection circuit 250 is connected to a PV input 101 (IN+) side (end a) of an inductance L1 included in the PV input means 200 and to the other end b of this inductance L1. The surge protection circuit 250 is connected in parallel to the inductance L1. The other end b of the inductance L1 is connected to the switching means 300 that includes the first switching transistor Q1, the second switching transistor Q2, the fourth switching transistor Q4 and the fifth switching transistor Q5. A DC voltage output of the voltage doubler rectification means 400 is input into a power conditioner 150 that converts the input voltage into an AC voltage output and outputs it to an external system.

An end a of the primary winding on the primary side of a transformer T1 included in the voltage doubler rectification means 400 is connected to the source electrode of the second switching transistor Q2 included in the switching means 300 and to the drain electrode of the third switching transistor Q3. The other end b on the primary side of the transformer T1 is connected to the source electrode of the fourth switching transistor Q4 and to the drain electrode of the fifth switching transistor Q5.

An end c of secondary winding (on the secondary side) of the transformer T1 that has the same polarity as the end a on the primary side is connected to the anode of a first diode D1 and the cathode of a second diode D2. Another end d is connected to a series connection point between a first capacitor C1 and a second capacitor C2, which are connected in series. The free end of the first capacitor C1 is connected to the cathode of the first diode D1 and one output 104 (OUT+) between the optimizer outputs. The free end of the second capacitor C2 is connected to the anode of the second diode D2 and the other output 105 (OUT−) between the optimizer outputs.

The source of the first switching transistor Q1 included in the switching means 300, the source of the third switching transistor Q3, and the source of the fifth switching transistor Q5 are connected to the ground. The second transistor Q2 and the fourth switching transistor Q4 constitute a high-side switch. The third switching transistor Q3 and the fifth switching transistor Q5 constitute a low-side switch.

The surge protection circuit 250 provided for the input means 200 includes: the inductance L1 whose end a is connected to the input 101 (IN+) for receiving the (+) output of the PV panel; the sixth switching transistor (one switching transistor) Q6 whose source electrode is connected through a third diode (one diode) D3 to the one end a of the inductance L1 and whose drain electrode is connected to the other end b of the inductance L1; and the seventh switching transistor (other switching transistor) Q7 whose drain electrode is connected to the source electrode of the sixth switching transistor Q6 and whose source electrode is connected to the ground. The third diode D3, whose anode is connected to the source electrode of the sixth switching transistor Q6 and whose cathode is connected to the one terminal a of the inductance L1, is connected between the source electrode of the sixth switching transistor Q6 and the one terminal a of the inductance L1.

The circuit further includes a fourth diode (other diode) D4 whose cathode is connected to the connection point between the source electrode of the sixth switching transistor Q6 and the drain electrode of the seventh switching transistor Q7 and whose anode is connected to the ground. The fourth diode (other diode) D4 may be omitted in a case where a parasitic diode (not shown in the circuit diagram) present in the inside of the seventh switching transistor Q7 can substitute for the fourth diode. In the case where the parasitic diode present in the seventh switching transistor Q7 can substitute, the characteristics (maximum forward current value and the like) of the parasitic diode include characteristics required for the fourth diode.

Thus, Embodiment 1 has a configuration that includes, in the input circuit, the sixth switching transistor Q6, or the sixth switching transistor Q6 and seventh switching transistor Q7, in order to prevent the surge voltage from occurring in the inductance L1.

The output of the PV optimizer 100 is input into the power conditioner 150 (see FIG. 5), and is output as a predetermined AC voltage to the commercial power system.

The sixth switching transistor Q6 and the seventh switching transistor Q7 operate only when the power output of the PV panel is small and normal control cannot be performed. As the power output increases, Q6 is automatically brought into a state of being OFF through PWM control or PFM control in midstream. The "midstream" is any time point in the first or latter half range of the switching period T during which the PWM control or PFM control is executed.

Hereinafter, the operation of the surge protection circuit is sequentially described. In the diagram, T denotes a time period of one period of the switching frequency, "A" denotes the first half of the time period T, and "B" denotes the latter half of this time period. "Q1-G" to "Q7-G" denote application levels and timing of gate signals (gate pulses) for turning on and off the first to seventh switching transistors shown in FIG. 1. A high level "H" indicates the gate signal for turning on the switching transistor. A low level "L" indicates the gate signal for turning off the switching transistor.

FIG. 2 shows the control timing for the switching transistor in a case where the output of the PV panel is significantly small. In "A" in FIG. 2, the width of a pulse Aa of the gate signal Q1-G is significantly narrow (short duration), and the input voltage into the switching means 300 does not decrease much even if the power output of the PV panel is small. That is, the pulse width is that with a small effect of the load. The inductance L1 excited during the time period of the pulse width of the pulse Aa is transmitted to the end a on the primary side of the transformer T1 constituting the voltage doubler rectification means 400 in the time period of the pulse Ab. A long duration of the pulse Ab causes a short circuit. The time of exciting the end a on the primary side of the transformer T1 is limited to the duration of the pulse Ab, and the second switching transistor Q2 is turned off.

Thus, the transformer T1 of the voltage doubler rectification means 400 and the inductance L1 of the input means 200 are terminated. However, the surge voltage to occur in the inductance L1 can be absorbed by short-circuiting the added sixth switching transistor Q6 at the same time. At the same time, the third switching transistor Q3 is turned on to short-circuit the transformer T1. To charge the power source of a high-side driver, the seventh switching transistor Q7 is set in a phase opposite to that of the sixth switching transistor Q6 and charging is performed in the time period Aa+Ab.

Likewise, also in a case of "B" in FIG. 2, the width of a pulse Bb of the first switching transistor Q1-G is set significantly short as with the case of the pulse Aa of "A", transmission is made to the other end b on the primary side of the transformer T1 in a limited time of Bb after excitation of the inductance L1, and the fourth switching transistor Q4 is turned off.

Thus, the transformer T1 and the inductance L1 are terminated. Consequently, the surge voltage to occur in the inductance L1 can be absorbed by short-circuiting the added sixth switching transistor Q6 at the same time. At the same time, the fifth switching transistor Q5 is turned on to short-circuit the transformer T1. Likewise, in the case of the seventh switching transistor Q7, the power source of the high-side driver is charged in the time period Ba+Bb in a phase opposite to that of the sixth switching transistor Q6.

FIG. 2 shows the control timing for the switching transistor in a case where the power output of the PV panel is large. As the power output of the PV panel increases, the increase is detected and control is performed, which causes the transformer T1 to slightly increase the widths of the pulse Aa and pulse Ba of the gate signal Q1-G of the first switching transistor Q1 to in turn increase the excitation time for the inductance L1. The widths of the pulse Ab and pulse Bb, which are transmission time for the transformer T1 after excitation of the inductance L1, are controlled so as to be increased in proportion to the pulse width of the gate signal Q1-G of the first switching transistor Q1. This control increases the width of the pulse Aa and the width of the pulse Ba of the gate signal Q1-G to a certain extent and, in turn, increases the width of the pulse Ab and the width of the pulse Bb (increases time), which are transmission time of the transformer T1, and reduces the time of pulse Ac and pulse Bc in which the transmission is off at the same time.

FIG. 2 shows the control timing for the switching transistor in a process during which the power output of the PV panel increases and reaches the normal operation state [4]. Through the control in FIG. 2, the waveform of control timing becomes that as show in FIG. 2, and is changed to the normal operation state (FIG. 2).

As described above, when the power output of the PV panel is significantly small, the state is brought into that where the period T of the switching frequency is increased and the pulse width of the gate signal is narrow, and the operation is started. With the maximum power point tracking control (MPPT), the period is reduced as the power output of the PV panel increases. When the period reaches a certain period, the pulse width is then increased, thereby achieving operation as that of the DC-DC converter for original MPPT control.

On the contrary, when it is becoming evening and the power output of the PV panel gradually decreases, the pulse width is gradually reduced while MPPT control is performed in a manner inverted to that in the above description. When the width decreases to a certain (minimum) pulse width, the period is then increased, and the state is in a waiting state until the control finally becomes impossible in the default state.

According to Embodiment 1, the surge voltage can be prevented from occurring by the operation of the protection circuit provided for an input circuit, breakage of the switching transistors can be prevented, and stable operation even with variation in the output of the PV panel can be achieved.

Embodiment 2

Figure 3:
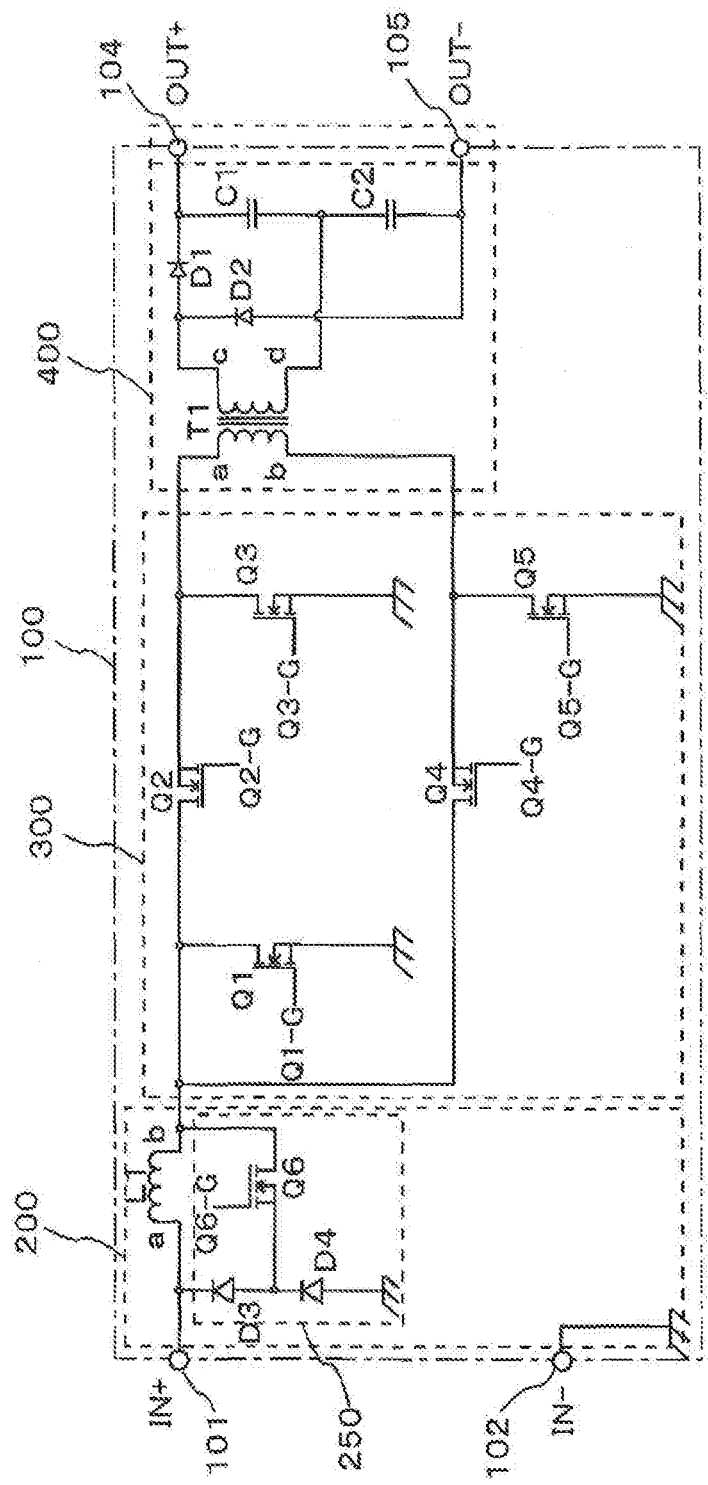
FIG. 3 is a circuit diagram showing a configuration of Embodiment 2 of the solar photovoltaic output optimizer circuit of the present invention.

FIG. 3 is a circuit diagram for illustrating the configuration of Embodiment 2 of the solar photovoltaic output optimizer circuit of the present invention. In the aforementioned Embodiment 1, the input means 200 is provided with the surge protection circuit that includes the sixth switching transistor Q6 and the seventh switching transistor Q7. In Embodiment 2, the surge protection circuit provided for the input means 200 is configured by removing the seventh switching transistor Q7 from the circuit shown in FIG. 1 and by including only the sixth switching transistor Q6, the third diode D3 and the fourth diode D4.

The operation of the solar photovoltaic output optimizer circuit of Embodiment 2 of the present invention shown in FIG. 3 is that obtained by removing the portion corresponding to the seventh switching transistor Q7 in the description of Embodiment 1. That is, the circuit is that obtained by removing the high-side driver.

Also according to Embodiment 2, a configuration of the high-side driver made up of an insulation type circuit can prevent the surge voltage from occurring by the operation of the protection circuit provided for the input circuit, prevent breakage of the switching transistors, and achieve stable operation even with variation in the output of the PV panel.

Figure 4:
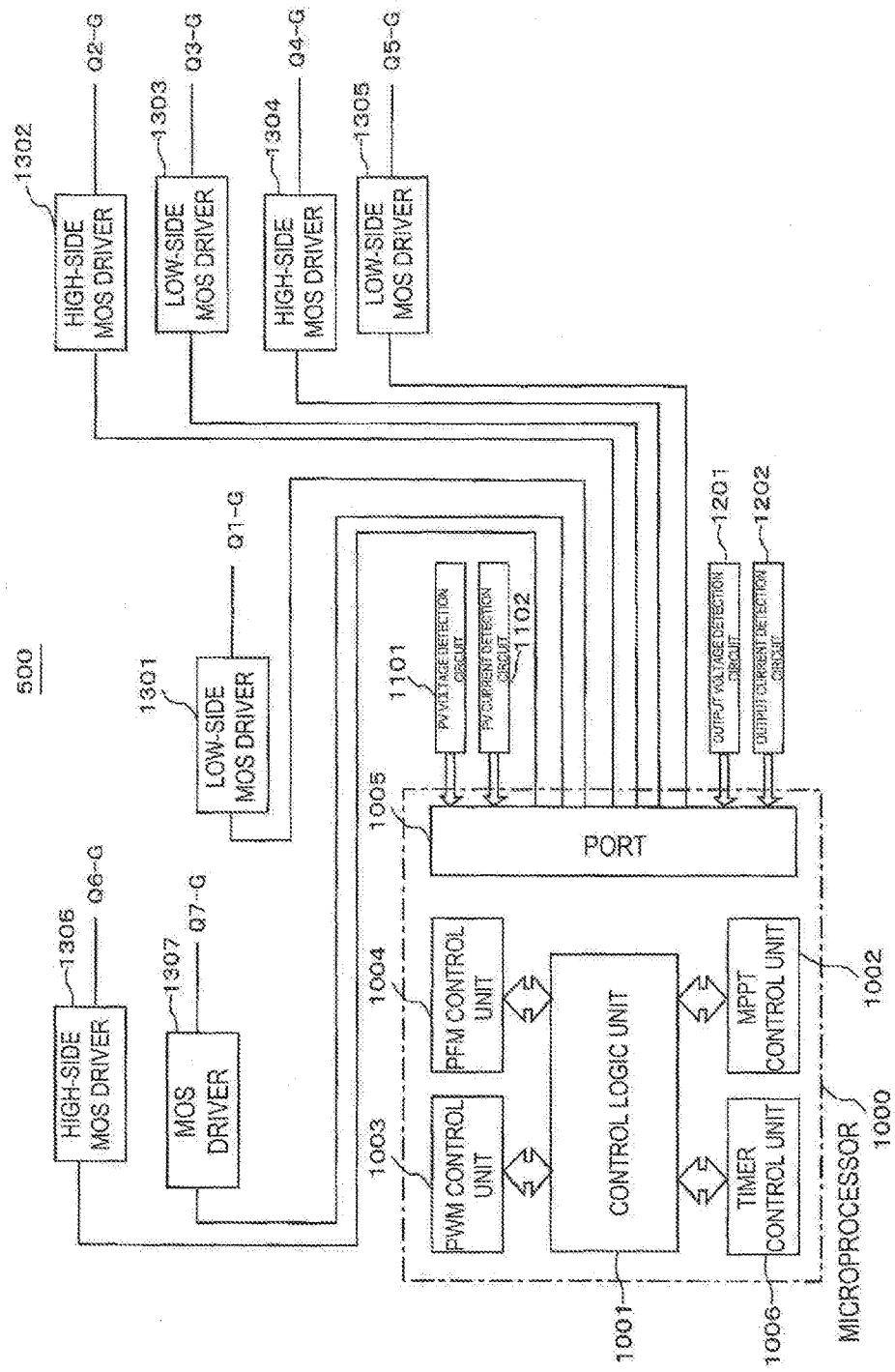
FIG. 4 is a block diagram for illustrating a control circuit that generates gate signals Q1-G to Q7-G to control turning on and off of the switching transistors constituting the solar photovoltaic output optimizer circuit of the present invention.

Next, control signal generation by the switching transistors described in Embodiment 1 and Embodiment 2 described above will be described. FIG. 4 is a block diagram for illustrating a control circuit that generates gate signals Q1-G to Q7-G to control turning on and off of the switching transistors constituting the solar photovoltaic output optimizer circuit of the present invention. This control circuit 500 includes a microprocessor 1000, various sensors (detection circuit), and MOS drivers for driving the gates of the switching transistors.

The microprocessor 1000 includes a control logic 1001, an MPPT control unit 1002, a PWM control unit 1003, a PFM control unit 1004, a timer control unit 1006, and a port 1005. This port 1005 is connected with a PV voltage detection circuit 1101 that detects the voltage of the PV panel, a PV current detection circuit 1102 that detects the current of the PV panel, an output voltage detection circuit 1201 that detects the output voltage of the solar photovoltaic output optimizer circuit 100, an output current detection circuit 1202 that detects the output current thereof, and various MOS drivers.

The various MOS drivers include: a low-side MOS driver 1301 that drives the first switching transistor Q1, a high-side MOS driver 1302 that drives the second switching transistor Q2, a low-side MOS driver 1303 that drives the third switching transistor Q3, a high-side MOS driver 1304 that drives the fourth switching transistor Q4, a low-side MOS driver 1305 that drives the fifth switching transistor Q5, a high-side MOS driver 1306 that drives the sixth switching transistor Q6, and a MOS driver 1307 that drives the seventh switching transistor Q7.

Before the gates of the switching transistors, the respective MOS drivers for driving the gates are provided. The drivers are connected to the respective signals generated by the control circuit in FIG. 4 to control turning on and off the switching transistors.

All the signals of the control circuit are controlled by the microprocessor (MPU) 1000. The MPU 1000 generates a signal for the control logic 1001 based on a control input signal according to programmed software, and transmits the drive signals (gate signals) to the switching transistors. Input and output signals of the MPU 1000 form a feedback (FB) loop.

Input signals used by the MPU 1000 to control the solar photovoltaic output optimizer circuit 100 are transmitted to the control logic unit 1001 of this MPU through the input port 1005 from the detection circuits, which are the PV voltage detection circuit 1101, the PV current detection circuit 1102, the output voltage detection circuit 1201, and the output current detection circuit 1202.

The MPU 1000 includes the PWM control unit 1003, the PFM control unit 1004, the timer control unit 1006, and the MPPT control unit 1002, for basic control. The control logic unit 1001 forms an optimal control logic on the basis of the control units and the detected signals input from the detection circuits. Finally, signals used for driving the gates of the switching transistors are generated by the control logic unit, and transmitted through the port 1005 to the drivers 1301 to 1306.

Figure 5:
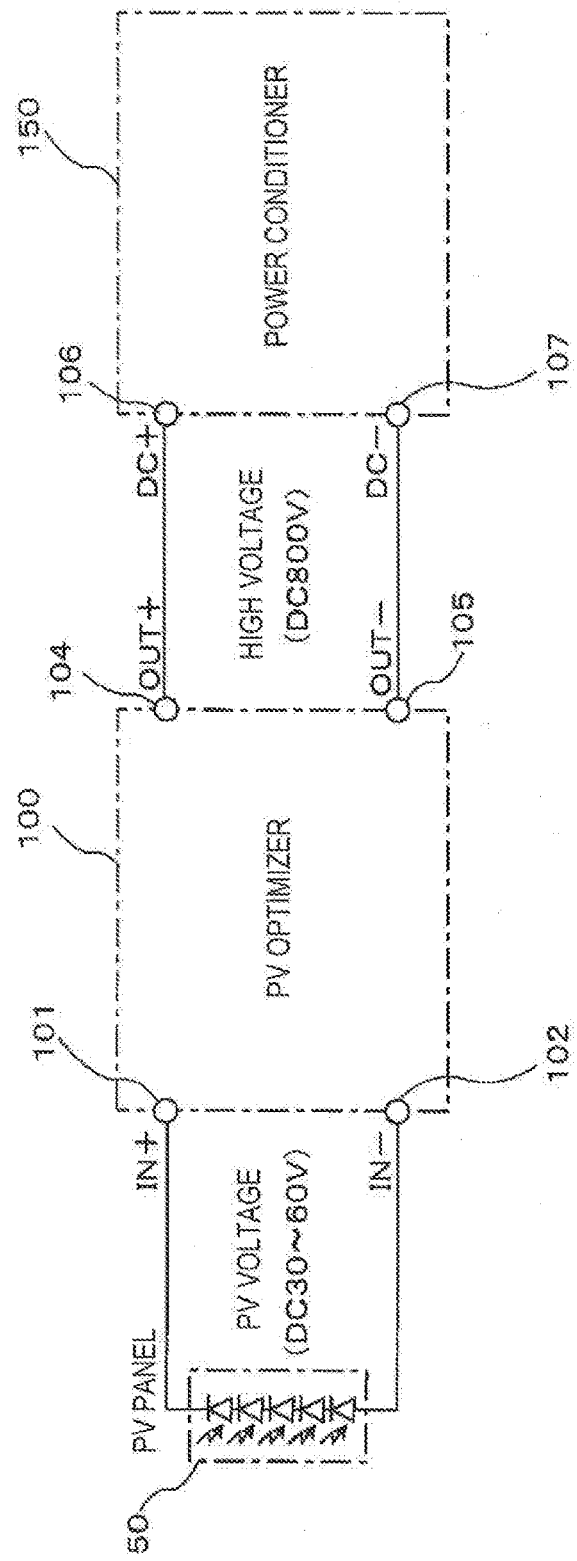
FIG. 5 is a diagram for illustrating a connection state of a solar photovoltaic output optimizer circuit according to the present invention in a solar photovoltaic panel power generation system.
Figure 6:
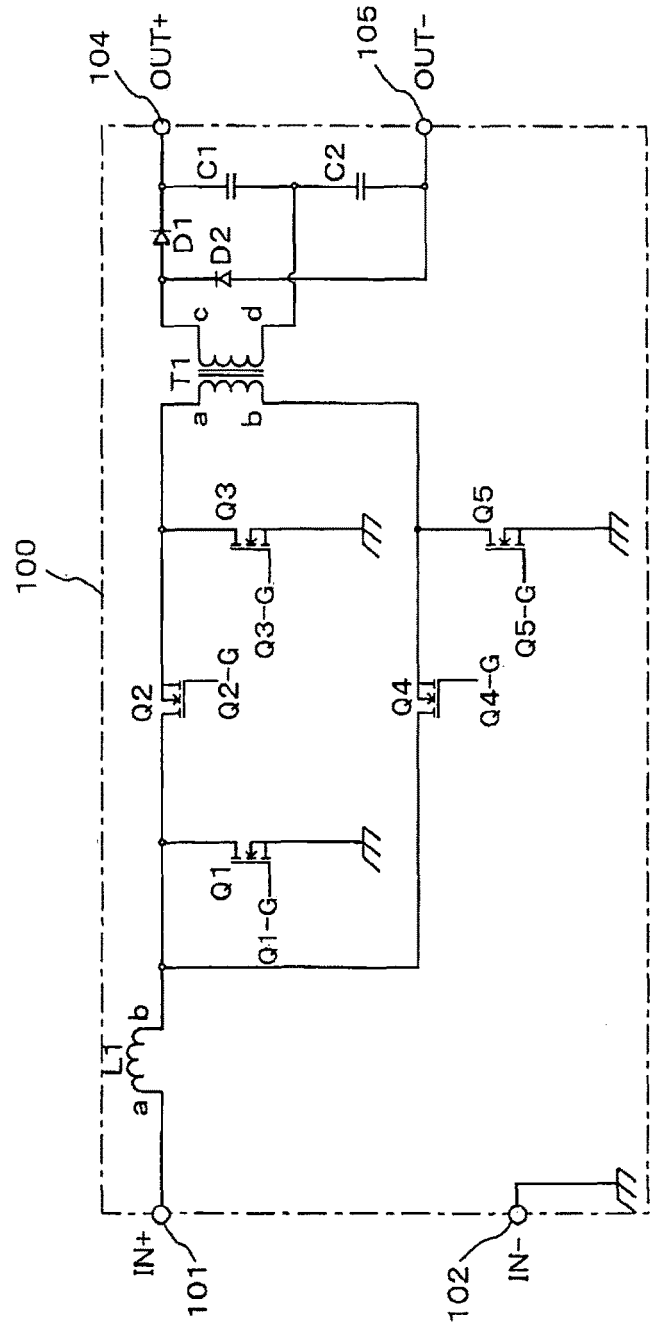
FIG. 6 is a circuit diagram illustrating a basic configuration of a conventional PV optimizer.

FIG. 5 is a diagram for illustrating a connection state of a solar photovoltaic output optimizer circuit according to the present invention in a solar photovoltaic panel power generation system. The output of the PV panel 50 is connected to the inputs 101 (IN+) and 102 (IN−) of the solar output (PV) optimizer 100. Specifically, the output voltage range of the PV panel 50 is 30 to 60 V/300 W (current is 10 Amax). The value is not necessarily limited thereto, and may be another value, according to selection of the constant and the like (e.g., the winding ratio of the transformer T1).

The outputs 104 (OUT+) and 105 (OUT−) of the PV optimizer 100 are connected to the respective inputs 106 (DC+) and 107 (DC−) of the power conditioner 150. The recommended input voltage of the power conditioner 150 is that of a constant voltage load with 700 to 800V. However, a certain extent of voltage range is allowed. The selection of the constant and the like allows input with further wide voltage range. The AC output of the power conditioner 150 is connected to the commercial power system and the like, not shown.

In an actual connection, the PV panel 50 at a solar photovoltaic power generation site is made up of a plurality of panels. Consequently, the PV optimizers 100 according to the present invention are attached to the respective PV panels, and all the outputs thereof are connected in parallel. Unlike series connection for a typical PV panel, a concept of string is absent. Consequently, each PV panel can output the maximum power.

INDUSTRIAL APPLICABILITY

In the above embodiments, the present invention is described as application to the power harvesting system that includes the solar photovoltaic panel. Alternatively, the present invention is also applicable to an energy source that has varying power output, for example, a step-up system of a battery and a storage battery in an analogous manner.

REFERENCE SIGNS LIST

50 . . . Solar photovoltaic panel (PV panel)
100 . . . PV optimizer
101 . . . PV input (+)
102 . . . PV input (−)
103 . . . Gate terminal of seventh switching transistor Q7
104 . . . PV output (+)
105 . . . PV output (−)
150 . . . Power conditioner
200 . . . Input means
250 . . . Surge protection circuit
300 . . . Step-up means
400 . . . Voltage doubler rectification means
Q1 to Q7 . . . Switching transistor
D1 to D4 . . . Diode
C1, C2 . . . Capacitor
L1 . . . Inductance
T1 . . . Transformer

The invention claimed is:

1. A solar photovoltaic output optimizer circuit used for a solar photovoltaic power generation system for stably harvesting power from power output of a solar photovoltaic panel having varying output,
    wherein the optimizer includes: a PV input circuit configured to receive output of the solar photovoltaic panel; a step-up circuit configured to convert a DC voltage input into the PV input circuit into a predetermined pulse voltage or AC voltage; and a voltage doubler rectification circuit configured to step up power output of the step-up circuit to a predetermined voltage, and
    the PV input circuit includes: an inductance connected in series to (+) output of a PV panel; and a surge protection circuit that is connected in parallel to the inductance, operates so as to absorb surge voltage to occur in output of the inductance only when output of the PV panel is under a first predetermined value and normal control cannot be performed, and is automatically separated from the inductance when the output of the PV panel is above a second predetermined value.

2. The solar photovoltaic output optimizer circuit according to claim 1, wherein the surge protection circuit of the solar photovoltaic output optimizer circuit includes: the inductance whose one end is connected to an input PV input (+) for receiving (+) output of the PV panel; one switching transistor whose source electrode is connected through one diode to the one end of the inductance and whose drain electrode is connected to another end of the inductance; and another switching transistor whose drain electrode is connected to the source electrode of the one switching transistor and whose source electrode is connected to a ground, and the one diode whose anode is connected to the source electrode of the one switching transistor and whose cathode is connected to one terminal of the inductance is connected between the source electrode of the one switching transistor and the one terminal of the inductance, and
    the surge protection circuit further includes another diode whose cathode is connected to a connection point between the source electrode of the one switching transistor and the drain electrode of the another switching transistor and whose anode is connected to the ground.

3. The solar photovoltaic output optimizer circuit according to claim 1, wherein the surge protection circuit of the solar photovoltaic output optimizer circuit is configured by connecting, to each other: the inductance whose one end is connected to an input PV input (+) for receiving (+) output of the PV panel; and one switching transistor whose source electrode is connected through one diode to the one end of the inductance and whose drain electrode is connected to another end of the inductance, and the one diode whose anode is connected to the source electrode of the one switching transistor and whose cathode is connected to one terminal of the inductance is connected between the source electrode of the one switching transistor and the one terminal of the inductance, and the surge protection circuit further includes another diode whose cathode is connected to the source electrode of the one switching transistor and whose anode is connected to the ground.

4. The solar photovoltaic output optimizer circuit according to claim 1, wherein the step-up circuit of the solar photovoltaic output optimizer circuit includes: a first switching transistor whose drain electrode is connected to an end of the inductance and whose source electrode is connected to the ground; a second switching transistor whose drain electrode is connected to the end of the inductance and whose source electrode is connected to one input of the voltage doubler rectification circuit; a third switching transistor whose drain electrode is connected to the source electrode of the second switching transistor and whose source electrode is connected to the ground; a fourth switching transistor whose drain electrode is connected to the end of the inductance and whose source electrode is connected to another input of the voltage doubler rectification circuit; and a fifth switching transistor whose drain electrode is connected to the other input of the voltage doubler rectification circuit and whose source electrode is connected to the ground.

5. The solar photovoltaic output optimizer circuit according to claim 4, wherein the second switching transistor and the fourth switching transistor included in the step-up circuit of the solar photovoltaic output optimizer circuit operate as high-side switches, and the third switching transistor and the fifth switching transistor operate as low-side switches.

6. The solar photovoltaic output optimizer circuit according to claim 4, wherein the step-up rectification circuit of the solar photovoltaic output optimizer circuit includes:

a transformer whose one end on a primary side is connected to the source electrode of the second switching transistor included in the step-up circuit and the drain electrode of the third switching transistor;

a first diode whose anode is connected to one end on a secondary side of the transformer and whose cathode is connected to a (+) output terminal of the voltage doubler rectification circuit;

a second diode whose cathode is connected to the one end on the secondary side of the transformer and whose anode is connected to (−) output terminal of the voltage doubler rectification circuit;

a first capacitor whose one end is connected to another end on the secondary side of the transformer and whose another end is connected to the (+) output terminal of the voltage doubler rectification circuit; and a second capacitor whose one end is connected to the another end on the secondary side of the transformer and whose another end is connected to the (−) output terminal of the voltage doubler rectification circuit.

7. The solar photovoltaic output optimizer circuit according to claim 2, wherein the switching transistor included in the solar photovoltaic output optimizer circuit is an enhancement type N-channel power MOSFET.

8. The solar photovoltaic output optimizer circuit according to claim 1, wherein one output of the solar photovoltaic output optimizer circuit is connected to a power conditioner that outputs AC power to an external system.

9. The solar photovoltaic output optimizer circuit according to claim 1, wherein the solar photovoltaic output optimizer circuit is connected to each of a plurality of PV panels whose outputs are connected in parallel.

\* \* \* \* \*